(12) United States Patent
Weng et al.

(10) Patent No.: US 12,463,143 B2
(45) Date of Patent: Nov. 4, 2025

(54) CHIP PACKAGE WITH CORE EMBEDDED INTEGRATED DEVICES

(71) Applicant: XILINX, INC., San Jose, CA (US)

(72) Inventors: Li-Sheng Weng, San Diego, CA (US); Suresh Ramalingam, Fremont, CA (US)

(73) Assignee: XILINX, INC., San Jose, CA (US)

(*) Notice: Subject to any disclaimer, the term of this patent is extended or adjusted under 35 U.S.C. 154(b) by 531 days.

(21) Appl. No.: 17/888,293

(22) Filed: Aug. 15, 2022

(65) Prior Publication Data
US 2024/0055359 A1    Feb. 15, 2024

(51) Int. Cl.
| | |
|---|---|
| *H01L 23/538* | (2006.01) |
| *H01L 21/50* | (2006.01) |
| *H01L 23/498* | (2006.01) |
| *H10D 1/20* | (2025.01) |
| *H10D 1/68* | (2025.01) |
| *H01L 23/00* | (2006.01) |

(52) U.S. Cl.
CPC .......... *H01L 23/5389* (2013.01); *H01L 21/50* (2013.01); *H01L 23/49816* (2013.01); *H01L 23/5383* (2013.01); *H01L 23/5384* (2013.01); *H01L 23/5385* (2013.01); *H01L 23/5386* (2013.01); *H10D 1/20* (2025.01); *H10D 1/68* (2025.01); *H01L 24/13* (2013.01); *H01L 24/16* (2013.01); *H01L 24/32* (2013.01); *H01L 24/73* (2013.01); *H01L 2224/13147* (2013.01); *H01L 2224/16227* (2013.01); *H01L 2224/32225* (2013.01); *H01L 2224/73204* (2013.01)

(58) Field of Classification Search
CPC ........... H01L 23/5389; H01L 23/49816; H01L 23/5383
See application file for complete search history.

(56) References Cited

U.S. PATENT DOCUMENTS

| | | | |
|---|---|---|---|
| 8,227,904 B2 | 7/2012 | Braunisch et al. | |
| 9,865,387 B2 | 1/2018 | Albers et al. | |
| 10,085,342 B2 | 9/2018 | Cheah et al. | |
| 10,163,557 B2 | 12/2018 | Lambert et al. | |
| 2012/0261838 A1 | 10/2012 | Braunisch et al. | |
| 2014/0217547 A1 | 8/2014 | Elsherbini et al. | |
| 2014/0264791 A1 | 9/2014 | Manusharow et al. | |
| 2015/0011050 A1 | 1/2015 | Chiu et al. | |
| 2016/0190113 A1* | 6/2016 | Sharan | H01L 23/5223 257/532 |
| 2016/0316566 A1* | 10/2016 | Sakai | H05K 3/4644 |
| 2020/0402934 A1* | 12/2020 | Kim | H01F 17/0006 |

OTHER PUBLICATIONS

U.S. Appl. No. 17/669,252, filed Feb. 10, 2022.

* cited by examiner

*Primary Examiner* — Errol V Fernandes
(74) *Attorney, Agent, or Firm* — Patterson + Sheridan, LLP

(57) ABSTRACT

A chip package and methods for fabricating the same are provided that include integrated devices embedded and coupled in series between a lower surface of a package substrate and an integrated circuit die of the chip package. In some examples, the integrated devices are disposed side by side embedded in a common package substrate. In other examples, one of the series coupled integrated devices is embedded in a first package substrate while another of the series coupled integrated devices is embedded in a second package substrate that is stacked directly in contact with the first package substrate. The integrated devices may be passive and/or active integrated devices.

20 Claims, 5 Drawing Sheets

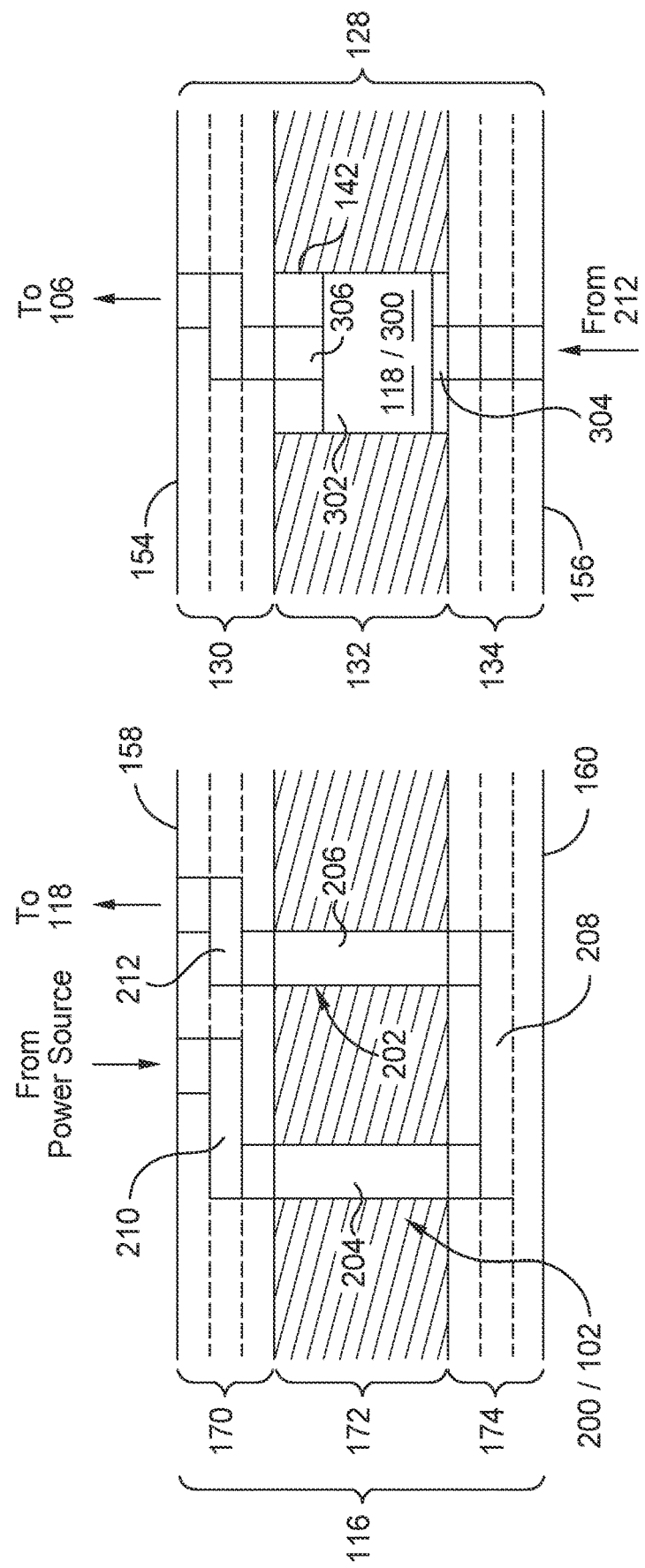

CHIP PACKAGE WITH CORE EMBEDDED INTEGRATED DEVICES

TECHNICAL FIELD

Embodiments of the present invention generally relate to a chip package having core embedded integrated devices, and in particular, to a chip package having integrated active and/or passive devices coupled in series between a bottom side of a package substrate and an integrated circuit die of the chip package.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a die side (i.e., top side) of the package substrate while a ball side (i.e., bottom side) of the package substrate is mounted to a printed circuit board (PCB). The IC dies may include memory, logic or other IC devices.

Decoupling capacitors are often used in chip packages to provide stable power to the circuitry of the IC dies utilized in the chip package. Conventionally, decoupling capacitors are mounted on the top and/or bottom surface of the package substrate. However at high frequencies, power and ground routings with the package substrate can impact the functional performance of the IC dies of the chip package due to its intrinsic inductance and resistance which detrimentally effect decoupling efficiency, and ultimately, the performance of the power delivery network. Instability of the power delivery network consequently diminishes the performance of IC dies of the chip package.

Therefore, a need exists for a chip package with improved capacitive decoupling in power delivery networks.

SUMMARY

A chip package and methods for fabricating the same are provided that include integrated devices embedded and coupled in series between a lower surface of a package substrate and an integrated circuit die of the chip package. The integrated devices may be active and/or passive devices. In some examples, the integrated devices are disposed side by side embedded in a common package substrate. In other examples, one of the series coupled integrated devices is embedded in a first package substrate while another of the series coupled integrated devices is embedded in a second package substrate that is stacked directly in contact with the first package substrate.

In another example, a chip package includes an integrated circuit (IC) die having functional circuitry, a first package substrate, a first integrated device (ID), and a second ID. The first package substrate has a top side and a bottom side. The first package substrate includes a first core having a vias disposed therethrough, a first cavity formed in the first core, first build-up layers, and first package circuitry having routing terminating on the top and bottom sides of the first package substrate. The first build-up layers have a first surface facing the IC die and defining the top side of the first package substrate. The first build-up layers have a second surface disposed on the first core. The first package circuitry has routing terminating on the top and bottom sides of the first package substrate. The routing passes through the vias and the first build-up layers. The second ID has an input coupled in series with an output of the first ID, and an output coupled to the functional circuitry of the IC die. The first and second ID's are of different types and are disposed between a bottom side of the IC die and the bottom side of the first package substrate. At least one of the first and second ID's is disposed in the first cavity formed in the first core.

In another example of a chip package, the first ID is disposed in the first cavity formed in the first core, and the second ID is disposed in a second cavity formed in the first core.

In another example of a chip package, a second package substrate is stacked in contact with the first package substrate. The second package substrate includes a first side and a second side, a second core having a vias disposed therethrough, a second cavity formed in the second core, a second build-up layers, and second package circuitry. The second build-up layers has a second surface facing the IC die and defining the top side of the second package substrate. The second build-up layers has a second surface disposed on the second core. The second package circuitry has routing terminating on the top and bottom sides of the second package substrate. The routing of the second package circuitry passes through the vias and the second build-up layers. The first package circuitry is coupled to IC die through the second package circuitry.

In another example of a chip package, the chip package includes an integrated circuit (IC) die having functional circuitry, a first package substrate, a second package substrate, an integrated device (ID), and an air core inductor. The first package substrate has a first core and first package circuitry terminating on a top surface and a bottom surface of the first package substrate. The bottom surface of the first package substrate is configured to couple to a printed circuit board via a socket or solder balls. The second package substrate has a second core and second package circuitry terminating on a top surface and a bottom surface of the second package substrate. The second package substrate is sandwiched between the first package substrate and the IC die. The second package substrate has the ID disposed therein that is coupled in series with the air core inductor. One terminal of the ID is coupled to the functional circuitry of the IC die.

In another example, a method for fabricating a chip package is provided that includes stacking a first package substrate containing an integrated device (ID) in contact with an integrated circuit (IC) die; and stacking a second package substrate with the first package substrate, the second package substrate containing an inductor coupled in series with the ID.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a schematic sectional view of an integrated device embedded in a package substrate and configured as an air core inductor.

FIG. 3 is a schematic sectional view of an integrated device embedded in a package substrate and configured as a decoupling capacitor.

To facilitate understanding, identical reference numerals have been used, where possible, to designate identical elements that are common to the figures. It is contemplated that elements of one embodiment may be beneficially incorporated in other embodiments.

DETAILED DESCRIPTION

Disclosed herein are chip packages and methods for fabricating the same that include integrated devices coupled in series between a bottom surface of a package substrate and an integrated circuit die of the chip package. The integrated devices, which may be passive and/or active devices, are embedded in at least one package substrate. In some examples, the series coupled integrated devices are disposed side by side embedded in a common package substrate. In other examples, one of the series coupled integrated devices is embedded in a first package substrate while another of the series coupled integrated devices is embedded in a second package substrate that is stacked directly in contact with the first package substrate. When used in a power delivery network, proximity of the series coupled integrated devices to an integrated circuit (IC) die of the chip package improves voltage regulating efficiency while beneficially reducing power loss. In implementations that utilize stacked package substrates, the stacked package substrates beneficially adds to the stiffness needed to maintain package mechanical integrity and warpage control. When one integrated device is configured as a capacitor and the other configured as an air core inductor, the configuration provides a much lower decoupling capacitor routing loop inductance as compared to on-package (i.e., surface mounted) decoupling capacitor solutions, thus beneficially lowering the power delivery network fabrication costs.

Beneficially, the configuration and techniques described above and further detailed below provide robust chip package with improved performance and reliability. Furthermore, the techniques described herein may be employed with little cost impact to the fabrication and assembly of the chip package.

Figure 1:
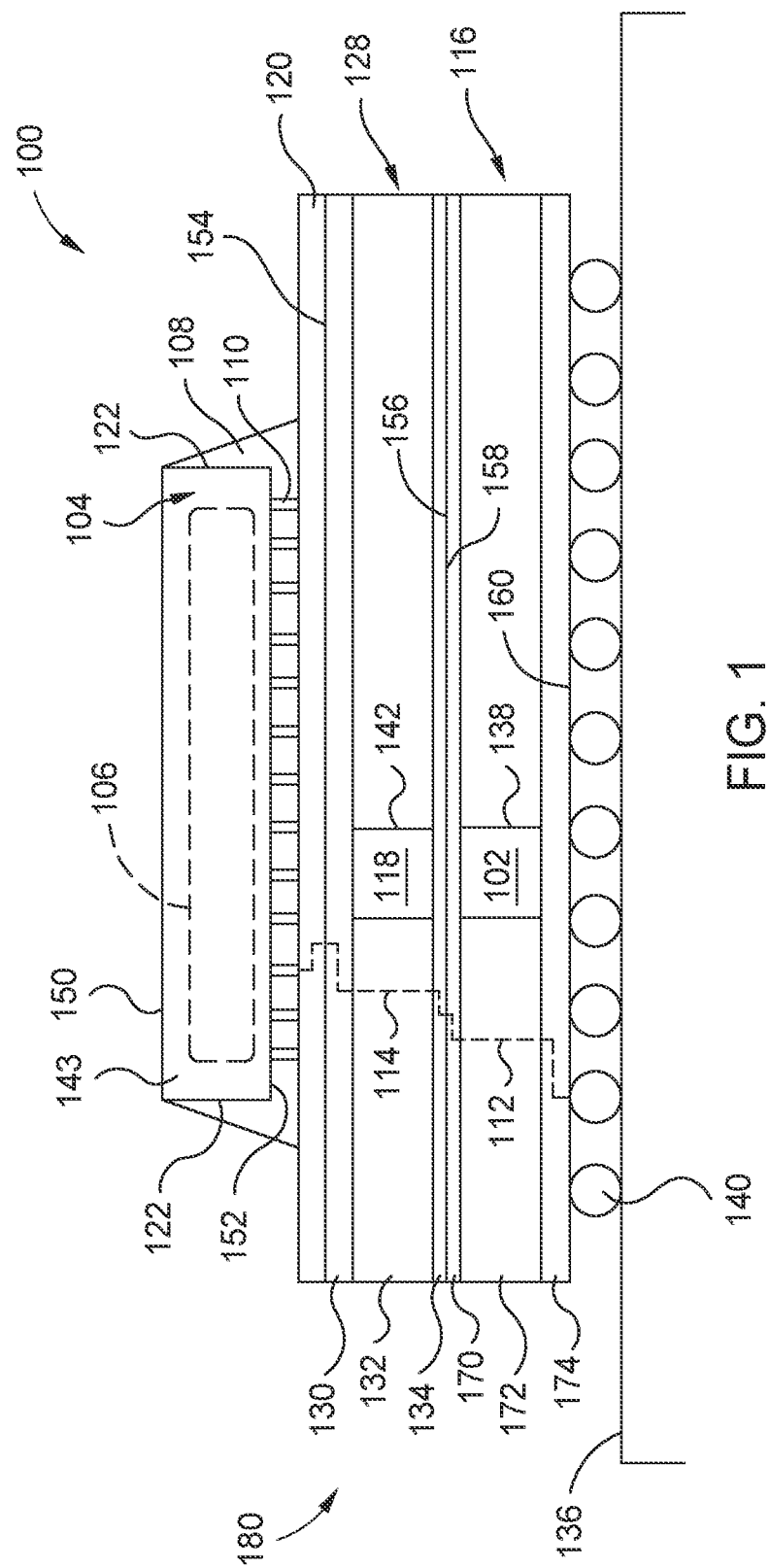
FIG. 1 is a schematic sectional view of a chip package having two integrated devices coupled in series that are embedded in separate package substrates.

Turning now to FIG. 1, a schematic sectional view of a chip package 100 is illustrated. The chip package 100 includes a first integrated device (ID) 102, at least one integrated circuit (IC) die 104, a first package substrate 116, a second ID 118 and a second package substrate 128. The first ID 102 may be a passive or active integrated circuit device. The second ID 118 may also be a passive or active integrated circuit device. The first and second IDs 102, 118 may be both be passive devices, may both be active devices, or one may be an active device while the other is a passive device. The first and second IDs 102, 118 are coupled in series and disposed in a location between the second package substrate 128 and the IC die 104.

The IC die 104 is disposed on the second package substrate 128, and the second package substrate 128 is disposed on the first package substrate 116. Mold compound 108 is disposed between the IC die 104 and the second package substrate 128. Pillars 110 may extend from the IC die 104 for making electrical connection between the functional circuitry 106 of the IC die 104 and the second package circuitry 114 of the second package substrate 128. Optionally, a redistribution layer 120 may be disposed between the pillars 110 extending from the IC die 104 and the second package substrate 128. The redistribution layer 120 includes a plurality of conductive layers and vias which are patterned to form the redistribution layer circuitry. The conductive layers and vias are separated by dielectric layers. There can be between two to seven patterned conductive layers forming the redistribution layer circuitry of the redistribution layer 120. The redistribution layer circuitry couples the pillars 110 extending from the IC die 104 to the second package circuitry 114 formed in the second package substrate 128. The redistribution layer 120, when present, provides a fanout of routing between the IC die 104 and the second package substrate 128. The second package circuitry 114 of the second package substrate 128 is connected to first package circuitry 112 of the first package substrate 116. The first package substrate 116 is configured to connect to via solder balls 140 (as shown) or via a socket to a printed circuit board (PCB) 136 to form an electronic device 180.

Both the first ID 102 and the second ID 118 are disposed between the IC die 104 and the first package substrate 116. In one example, both the first ID 102 and the second ID 118 are directly below and inward of the sidewalls 122 the IC die 104, which beneficially shortens the electrical path between the ID's 102, 118 and the functional circuitry 106 of the IC die 104, thus enhancing the performance of the IC die 104 and consequently, the chip package 100 and the electronic device 180.

The second ID 118 is disposed in the second package substrate 128 between the IC die 104 and the first package substrate 116, thus making the second ID 118 very close to the IC die 104 rather than beginning electrically separated from the IC die 104 such as a surface mounted element as found in conventional designs. Stated differently, the second ID 118 is disposed in the second package substrate 128 disposed immediately adjacent the IC die 104 without an intervening package substrate, interposer or IC die. Thus, the second ID 118 is disposed immediately adjacent the IC die 104 rather than beginning electrically separated from the IC die 104 by routing that passes completely through a package or other substrate.

The second ID 118 is a discrete, pre-formed device that is fully fabricated prior to attachment directly to the IC die 104 or indirectly to the IC die 104 through to the second package substrate 128. Some non-exhaustive examples of a second ID 118 that may be disposed within the second package substrate 128 include passive devices such as a resistor, a capacitor, an inductor, a coil, a balun, or an impedance matching element, among others. Some non-exhaustive examples of a second ID 118 that may be disposed within the second package substrate 128 include active devices such as a voltage source, a voltage regulator, a current source, a current regulator, a power generator, a transistor, and a diode, among others. Although in the example described herein with reference to FIG. 1 the second ID 118 is described as a decoupling capacitor, other types of IDs may be utilized for second ID 118 in the chip package 100.

As discussed above, the first ID 102 may also be an active or passive device. The first ID 102 may be the same or different type of device as compared to the second ID 118. Although in the example described with reference to FIG. 1 the first ID 102 is described as an inductor, such as an air core inductor, other types of IDs may be utilized for the second ID 118 in the chip package 100.

Turning now to the IC die 104 of the chip package 100, the IC die 104 includes functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads.

Pillars 110 are formed on the contact pads exposed on the die bottom surface 152 of the IC die 104. The pillars 110 are mechanically and electrically connected to conductive pads (not shown) formed in an upper (i.e., first) first build-up layer 130 of the second package substrate 128. The optional redistribution layer 120 may be disposed between and make electrical connection between the pillars 110 and the second package circuitry 114 of the second package substrate 128. At an appropriate time during fabrication of the chip package 100, the interstitial space around the pillars 110 may be filled with an underfill material and/or mold compound 108. Generally, the pillars 110 are formed on the IC die 104 prior to connecting the IC die 104 with the second package substrate 128, while the underfill material can be disposed around the pillars 110 at a later fabrication step. The pillars 110 form interconnect circuitry that connects the functional circuitry 106 of the IC die 104 to the second package circuitry 114 of the second package substrate 128.

In one example, the pillars 110 are formed by plating copper on the conductive contact pads formed on the die bottom surface 152 of the IC die 104. In other example, the pillars 110 may be formed using other suitable conductive material. The pillars 110 are also exposed through the bottom of the mold compound 108.

The first package substrate 116 includes the top side 158 and a bottom side 160. The first package substrate 116 includes upper build-up layers 170, a core 172 and optional lower build-up layers 174. The upper build-up layer 170 includes a plurality of conductive layers and via that are patterned to provide routing of a portion of the first package circuitry 112. One end of the second package circuitry 114 formed in the upper build-up layer 130 terminates at the top side 158 where the second package circuitry 114 connects to the second package circuitry 114 of the second package substrate 128. The other end of the first package circuitry 112 formed in the upper build-up layer 170 terminates at vias formed through the core 172. The lower build-up layer 174 may be fabricated similar to the upper build-up layer 170.

The second package substrate 128 includes a top surface 154 and a bottom surface 156. The second package substrate 128 includes the upper build-up layers 130, a core 132 and optional lower build-up layers 134. The upper build-up layer 130 includes a plurality of conductive layers and via that are patterned to provide routing of a portion of the second package circuitry 114. One end of the second package circuitry 114 formed in the upper build-up layer 130 terminates at the bottom surface 156 where the second package circuitry 112 connects to the second package circuitry 114 of the second package substrate 128. The other end of the second package circuitry 114 formed in the upper build-up layer 130 terminates at vias formed through the core 132. The lower build-up layer 134 may be fabricated similar to the upper build-up layer 130. Optionally, the core 132 of the second package substrate 128 may be directly laminated to the core 172 of the first package substrate 116 such that the cavities 142, 138 align to form a single opening that accommodates both the first and second IDs 102, 118.

In the example depicted in FIG. 1, the first ID 102 is disposed in a cavity 138 formed in the first package substrate 116. The cavity 138 formed in the first package substrate 116 may be formed by drilling, milling, etching or other suitable technique. The cavity 138 is sized to accommodate the first ID 102 therein. In another example, the first ID 102 may be an air core inductor.

FIG. 2 is a schematic sectional view of the first ID 102 configured as an air core inductor 200. The air core inductor 200 is formed in the first package substrate 116. The air core inductor 200 includes a coil 202 formed by routings comprising a portion of the first package circuitry 112. The coil 202 includes at least two parallel vias 204, 206 formed through the core 172 of the first package substrate 116. First ends of the vias 204, 206 are connected by bridge routing 208 formed in one of the build-up layers 170, 174 of the first package substrate 116. In the other of build-up layers 170, 174 that does not include the bridge routing 208, input routing 210 and output routing 212 are coupled to second ends of the vias 204, 206 opposite the bridge routing 208. The output routing 212 is coupled through the second package circuitry 114 to the second ID 118 disposed in the second package substrate 128. The input routing 210 may be connected to a power source disposed in the IC die 104 or other location. In one example, the air core inductor 200 is part of the power delivery network providing power to the functional circuitry 106 of the IC die 104 through the second ID 118.

FIG. 3 is a schematic sectional view of the second ID 118 configured as a decoupling capacitor 300. The decoupling capacitor 300 is disposed in a cavity 142 formed in the core 132 of the second package substrate 128. The decoupling capacitor 300 is connected to a portion of the second package circuitry 114. The decoupling capacitor 300 includes a body 302 having an input 304 and an output 306. The functional circuitry, e.g., the capacitive plates, are disposed within the body 302 and coupled to the input 304 and an output 306. The input 304 of the decoupling capacitor 300 is coupled via routing formed in one or both of the lower build-up layer 134 of the second package substrate 128 and the upper build-up layer 170 of the first package substrate 116 to the first ID 102, such as the air core inductor 200 depicted in FIG. 2. The output 306 of the decoupling capacitor 300 is coupled via routing formed in the upper build-up layer 130 of the second package substrate 128 and the optional redistribution layer 120 to the functional circuitry 106 of the IC die 104. In one example, the series connected first ID 102 and the second ID 118 are part of a power delivery network providing power to the functional circuitry 106 of the IC die 104.

In one example, the thickness of the core 132 of the second package substrate 128 is generally about 150 µm to about 200 µm thicker than the thickness (e.g., height) of the second ID 118 that that the input and outputs 304, 306 may be easily coupled to the second package circuitry 114 of the second package substrate 128. In some examples, the thickness of the core 132 of the second package substrate 128 is between about 260 µm to about 960 µm thick, and is also thinner than the core 172 of the first package substrate 116. In another example, the thickness of the core 132 of the second package substrate 128 is less than 1000 µm thick, and thinner than the core 172 of the first package substrate 116. The space defined between the sidewalls of the cavity 142 and the second ID 118 may be at least partially filled with a potting compound to secure the first ID 102 in the cavity 142.

Figure 4:
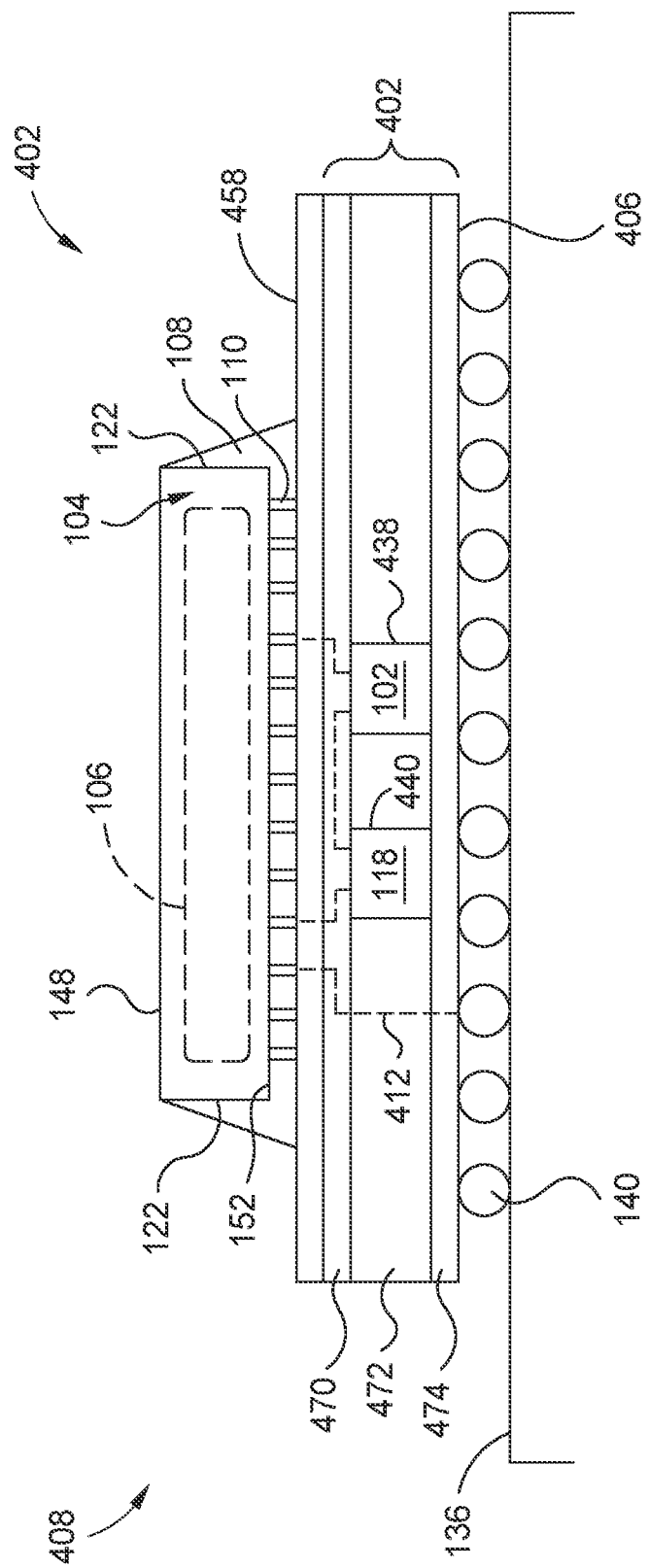
FIG. 4 is a schematic sectional view of a chip package having two integrated devices coupled in series and embedded in a common package substrate.

FIG. 4 is a schematic sectional view of a chip package 400 having two integrated devices 102, 118 coupled in series and embedded in a common package substrate 402. The chip package 400 is generally constructed similar to the chip package 100 described above, except wherein the common package substrate 402 includes both series connected ID 102, 118, as opposed to one series connected ID being in one substrate while the other series connected ID being in a second substrate. In one example, both the first and second IDs 102, 118 are inward of the sidewalls 122 of the IC die 104.

The package substrate 402 of the chip package 400 includes a top side 458 and a bottom side 460. The package substrate 402 includes upper build-up layers 470, a core 472 and optional lower build-up layers 474. The upper build-up layer 470 includes a plurality of conductive layers and via that are patterned to provide routing of a portion of a package circuitry 412 formed through the package substrate 402. One end of the package circuitry 412 formed in the upper build-up layer 470 terminates at the top surface 458 where the package circuitry 412 connects the IC die 104. The other end of the package circuitry 412 formed in the upper build-up layer 470 terminates at vias formed through the core 472. The lower build-up layer 474 may be fabricated similar to the upper build-up layer 470. The contacts formed on the lower build-up layer 474 are configured to connect to via solder balls 140 (as shown) or via a socket to a printed circuit board (PCB) 136 to form an electronic device 480.

In the example depicted in FIG. 4, the first ID 102 is disposed in a first cavity 438 formed in the package substrate 402. The first cavity 438 formed in the package substrate 402 may be formed by drilling, milling, etching or other suitable technique. The cavity 438 is sized to accommodate the first ID 102 therein. In another example, the first ID 102 may be an air core inductor, such as depicted in FIG. 2.

The second ID 118 is disposed in a second cavity 440 formed in the package substrate 402. The second cavity 440 formed in the package substrate 402 is adjacent the first cavity 438. The second cavity 440 is sized to accommodate the second ID 118 therein, such as shown in FIG. 2. In another example, the second ID 118 may be a capacitor, such as depicted in FIG. 3.

In one example, an input of the first ID 102 is coupled to a power distribution network through the upper or lower build-up layers 470, 472. An output of the first ID 102 is coupled to an input of the second ID 118. The connection between the output of the first ID 102 and the input of the second ID 118 may be made in routings formed in one of the upper or lower build-up layers 470, 472. An output of the second ID 118 is coupled to the functional circuitry 106 of the IC die 104 through the upper build-up layer 470.

Figure 5:
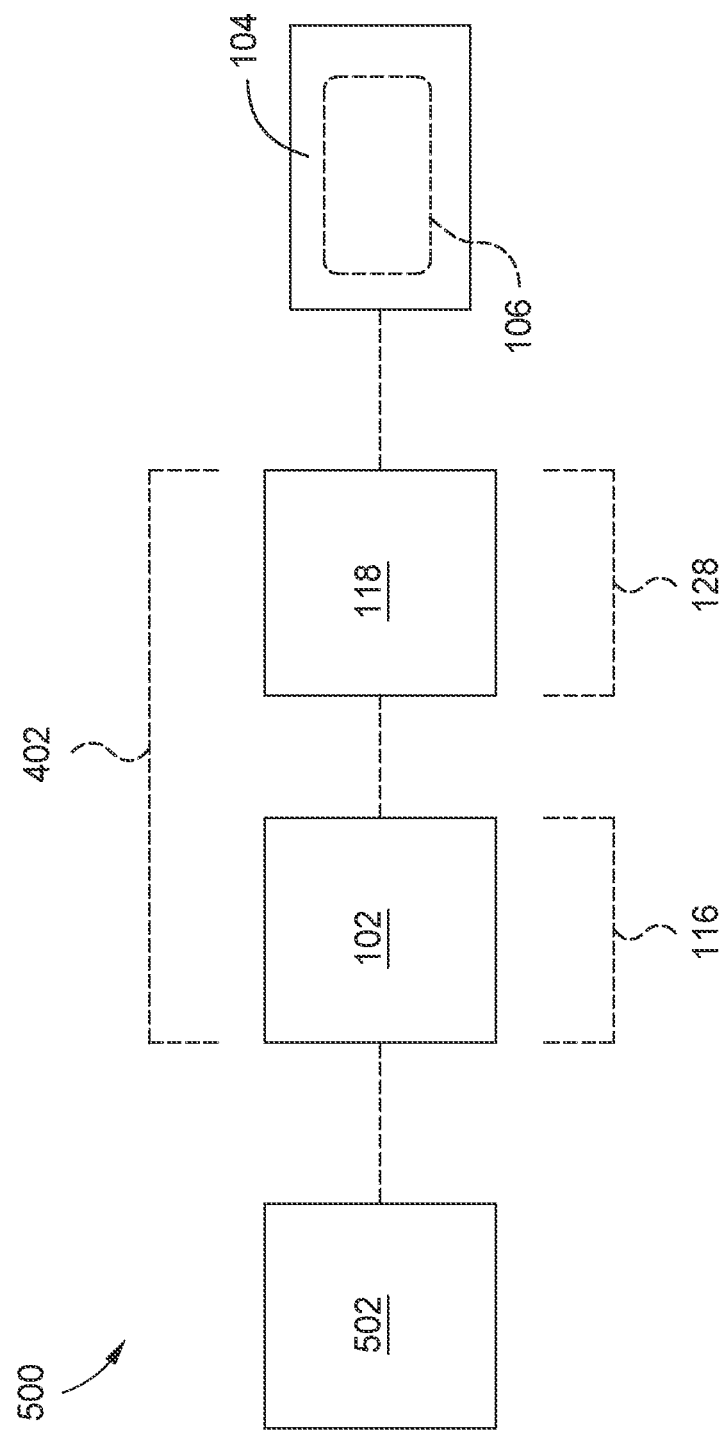
FIG. 5 is a schematic circuit diagram of a chip package illustrating one example of the connections between a first integrated device, a second integrated device, an integrated circuit (IC) die, and a power source.

FIG. 5 is a schematic circuit diagram 500 of a chip package illustrating one example of the connections between a first integrated device (ID) 102, a second integrated device (ID) 118, and an integrated circuit (IC) die 104. The chip package may be one of the chip packages described above, or another chip package. Although in the example depicted in FIG. 5 the first and second IDs 102, 118 are coupled in series between functional circuitry 106 of the IC die and a power source 502, the first and second IDs 102, 118 may be coupled to structures and devices other than a power source. The power source 502 may reside in the IC die 104, another IC die of the chip package containing the IC die 104, a location remove from the chip package containing the IC die 104, or another structure or device.

In the example depicted in FIG. 5, the output of the power source 502 is coupled to an input of the first ID 102. The output of the first ID 102 is coupled to an input of the second ID 118. The output of the second ID 118 is coupled to the functional circuitry 106 of the IC die 104.

As illustrated in FIG. 5, the first and second IDs 102, 118 may be disposed in a common substrate 402, such as described with reference to FIG. 4. Also as illustrated in FIG. 5, the first and second IDs 102, 118 may be disposed separate substrates 116, 128, such as described with reference to FIG. 1.

Figure 6:
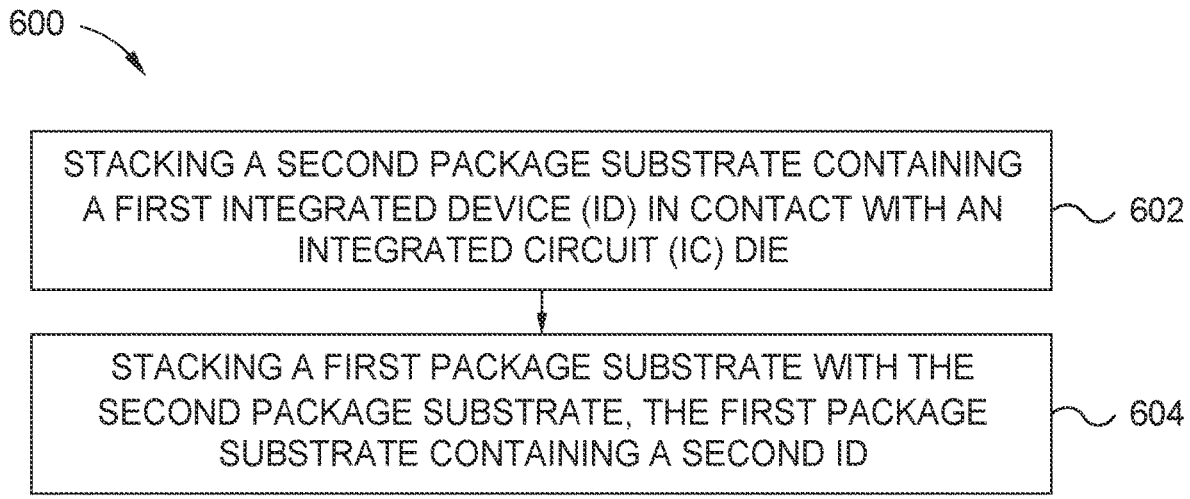
FIG. 6 is a flow diagram of a method for fabricating a chip package having integrated devices disposed between an integrated circuit (IC) die and a bottom side of a package substrate.

FIG. 6 is a flow diagram of a method 600 for fabricating a chip package 100 having integrated devices 102, 118 disposed between an integrated circuit (IC) die 104 and a bottom side 160 of a first package substrate 116. The method 600 for fabricating a chip package 100 begins at operation 602 by stacking a second package substrate 128 containing an integrated device (ID) 118 in contact with an IC die 104. Optionally, a redistribution layer 120 may be disposed between IC die 104 and the second package substrate 128. In one example, the first ID 118 is an inductor, such as an air core inductor. In another example, the first ID 118 is a preformed passive or active device.

The method 600 continues at operation 604 by stacking a first package substrate 116 with the second package substrate 128. The first package substrate 116 containing the second ID 102. Stacking the first package substrate 116 with the second package substrate 128 connects the first ID 118 in series with the second ID 102. In one example, the second ID 102 is an inductor, such as an air core inductor. In another example, the second ID 102 is a preformed passive or active device In one example, the method 600 forms a power delivery network connecting the series connect IDs 102, 118 to the functional circuitry 106 of the IC die 104. In the power delivery network, the first ID 102 is an inductor while the second ID 118 is a capacitor.

Figure 7:
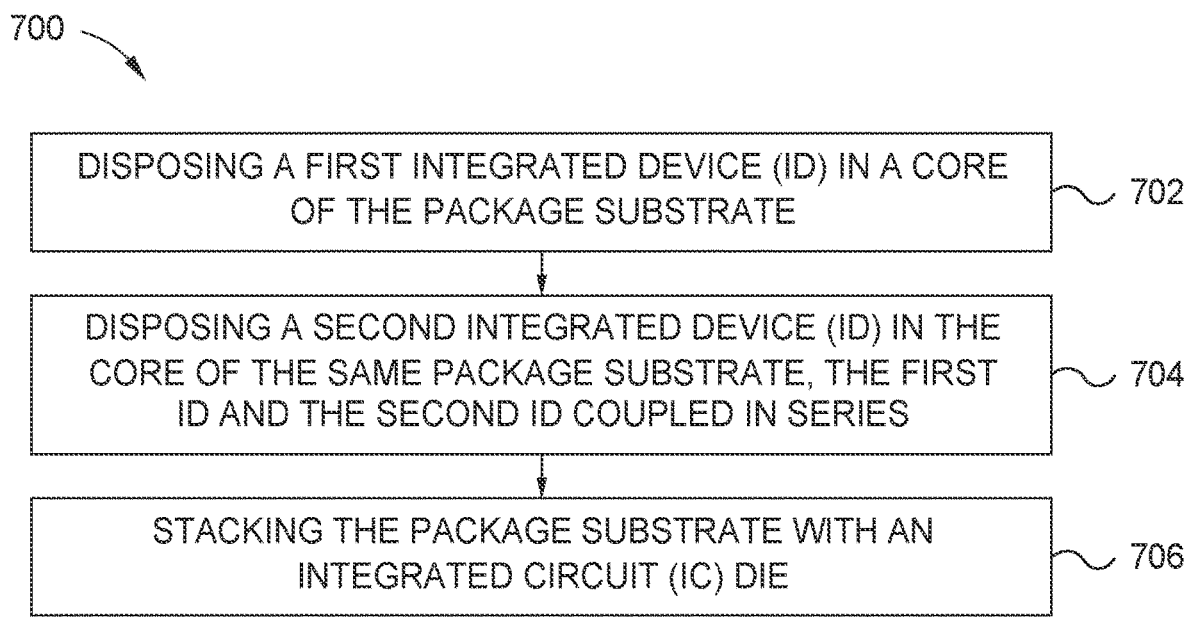
FIG. 7 is another flow diagram of a method for fabricating a chip package having integrated devices disposed between an integrated circuit (IC) die and a bottom side of a package substrate.

FIG. 7 is another flow diagram of a method 700 for fabricating a chip package 400 having integrated device 102, 118 disposed between an integrated circuit (IC) die 104 and a bottom side 460 of a package substrate 402. The method 700 for fabricating a chip package 100 begins at operation 702 by disposing a first integrated device (ID) 102 in a core 432 of the package substrate 402. In one example, the first ID 118 is a capacitor. The method 700 continues at operation 704 by disposing a second integrated device (ID) 118 in the core 432 of the same package substrate 402. The first ID 102 and the second ID 118 are coupled in series. In one example, the first ID 102 is an inductor, such as an air core inductor.

At operation 706, the package substrate 402 is stacked with the IC die 104. Stacking the package substrate 402 with the IC die 104 couples the output of the second ID 118 with the functional circuitry 106 of the IC die 104. Optionally, a redistribution layer 120 may be disposed between IC die 104 and the package substrate 402.

In one example, the method 700 forms a power delivery network connecting the series connect IDs 102, 118 to the functional circuitry 106 of the IC die 104. In the power delivery network, the first ID 102 is an inductor while the second ID 118 is a capacitor.

Thus, a chip package and method for fabricating have been described that includes integrated devices disposed between an IC die and a bottom surface of a package substrate. Positioning the integrated devices very close to the IC die avoids routing through fanouts, and improves communication speeds and reliability. Additionally, parasitic losses that occur in conventional routing of surface mounted integrated devices to the IC die through the package substrate are eliminated. When used in a power delivery network, proximity of the series coupled integrated devices to an integrated circuit (IC) die of the chip package improves voltage regulating efficiency while beneficially reducing power loss. In implementations that utilize stacked package substrates, the package substrates beneficially adds to the stiffness needed to maintain package mechanical integrity and warpage control. When one integrated device is configure as a capacitor and the other configured as an air core inductor, the configuration provides a much lower decoupling capacitor routing loop inductance as compared to on-package decoupling capacitor solutions, thus beneficially lowering the power delivery network fabrication costs.

While the foregoing is directed to embodiments of the present invention, other and further embodiments of the invention may be devised without departing from the basic scope thereof, and the scope thereof is determined by the claims that follow.

What is claimed is:

1. A chip package, comprising:
   a first package substrate, wherein a core of the first package substrate has a first cavity therein;
   a second package substrate having a first surface facing a first surface of the first package substrate, wherein a core of the second package substrate has a second cavity therein, and wherein the first and second cavities are vertically aligned with one another;
   an integrated circuit (IC) die adjacent to a second surface of the second package substrate;
   a first integrated device (ID) disposed within the first cavity; and
   a second IC disposed within the second cavity;
   wherein the first and second IDs are connected in series with another and electrically connected to circuitry of the IC die.

2. The chip package of claim 1, wherein the first ID comprises an inductor, and the second ID comprises a capacitor.

3. The chip package of claim 1, wherein the first and second cavities are vertically aligned with one another and with the IC die.

4. The chip package of claim 1, wherein the first ID comprises a capacitor.

5. The chip package of claim 1, wherein the first ID comprises an inductor.

6. The chip package of claim 5, wherein the inductor comprises an air core inductor.

7. The chip package of claim 5, wherein the second ID comprises a capacitor.

8. The chip package of claim 7, wherein the first ID is part of a power network coupled to the circuitry of the IC die.

9. The chip package of claim 1, wherein the second package substrate is disposed between the first package substrate and the IC die, without an intervening interposer.

10. The chip package of claim 8, wherein a second surface of the first package substrate is configured to couple to a printed circuit board via a socket or solder balls.

11. The chip package of claim 1, wherein the first package substrate is thicker than the second package substrate.

12. The chip package of claim 1, wherein IC die is hybrid bonded to the second surface of the second package substrate.

13. The chip package of claim 1, wherein the first and second IDs each comprises one or more of a resistor, a capacitor, an inductor, an air core inductor, a coil, a balun, and an impedance matching element.

14. A chip package, comprising:
   a first package substrate, wherein a core of the first package substrate has first cavity therein;
   a second package substrate having a first surface facing a first surface of the first package substrate, wherein a core of the second package substrate has a second cavity therein, and wherein the first and second cavities are vertically aligned with one another;
   an integrated circuit (IC) die adjacent to a second surface of the second package substrate;
   an inductor disposed within the first cavity;
   a capacitor disposed within the second cavity;
   wherein the inductor and the capacitor are connected in series with another and electrically connected to circuitry of the IC die, without an intervening interposer; and
   an integrated circuit (IC) die adjacent to a second surface of the second package substrate.

15. The chip package of claim 14, wherein the inductor comprises an air core inductor.

16. The chip package of claim 15, wherein the core of the first package substrate is thicker than the core of the second package substrate.

17. The chip package of claim 15, wherein the capacitor and the air core inductor are part of a power network of the IC die.

18. The chip package of claim 14, wherein IC die is hybrid bonded to the second package substrate, and wherein circuitry of the first and second package substrates are connected without solder.

19. A method, comprising:

disposing a first integrated device (ID) in a cavity of a first package substrate;

disposing a second integrated device (ID) in a cavity of a second package substrate;

vertically stacking the first package substrate, the second package substrate, and an integrated circuit (IC) die, with the second package substrate disposed between the first package substrate and the IC die, without an intervening interposer, wherein the cavities of the first and second package substrates are vertically aligned with one another; and connecting the first and second IDs in series with one another and to circuitry of the IC die.

20. The method of claim 19, wherein:

the first ID comprises an inductor;

the second ID comprises a capacitor; and the first and second IDs form part of a power delivery network of the IC die.

\* \* \* \* \*